(12) United States Patent
Hara

(10) Patent No.: US 7,358,602 B2
(45) Date of Patent: Apr. 15, 2008

(54) SEMICONDUCTOR CHIP, AND SEMICONDUCTOR WAFER INCLUDING A VARIABLE THICKNESS INSULATING LAYER

(75) Inventor: Kazumi Hara, Suwa (JP)

(73) Assignee: Seiko Epson Corporation (JP)

( * ) Notice: Subject to any disclaimer, the term of this patent is extended or adjusted under 35 U.S.C. 154(b) by 348 days.

(21) Appl. No.: 10/757,373

(22) Filed: Jan. 14, 2004

(65) Prior Publication Data

US 2004/0188822 A1 Sep. 30, 2004

(30) Foreign Application Priority Data

Jan. 15, 2003 (JP) ............................. 2003-007281

(51) Int. Cl.
*H01L 29/40* (2006.01)
*H01L 23/48* (2006.01)
*H01L 23/485* (2006.01)
*H01L 25/065* (2006.01)

(52) U.S. Cl. ......... 257/689; 257/E23.02; 257/E25.013; 257/E23.011; 257/773; 257/774; 257/680; 257/621; 257/700; 257/668; 257/730

(58) Field of Classification Search ........ 257/E23.011, 257/E25.013, E23.02, 689, 758, 773–776, 257/700–703, 751, 778, 734, 737, 738, 777, 257/685, 686, 690–693, 696, 698, 668, 621, 257/730, 680

See application file for complete search history.

(56) References Cited

U.S. PATENT DOCUMENTS

| | | | |
|---|---|---|---|
| 6,054,171 A | 4/2000 | Shoji | |
| 6,424,048 B1 | 7/2002 | Umetsu et al. | |
| 6,510,045 B2* | 1/2003 | Mido et al. | ................. 361/529 |
| 6,667,551 B2 | 12/2003 | Hanaoka et al. | |
| 6,693,358 B2* | 2/2004 | Yamada et al. | ............. 257/774 |
| 6,703,689 B2* | 3/2004 | Wada | ......................... 257/621 |
| 6,734,463 B2* | 5/2004 | Ishikawa | ...................... 257/79 |
| 6,768,205 B2* | 7/2004 | Taniguchi et al. | .......... 257/774 |
| 6,852,621 B2 | 2/2005 | Hanaoka et al. | |
| 6,873,054 B2* | 3/2005 | Miyazawa et al. | .......... 257/774 |
| 6,943,056 B2* | 9/2005 | Nemoto | ...................... 438/106 |

(Continued)

FOREIGN PATENT DOCUMENTS

JP 09-312295 12/1997

(Continued)

OTHER PUBLICATIONS

Communication from Korean Patent Office re: related application.

*Primary Examiner*—Alexander Oscar Williams
(74) *Attorney, Agent, or Firm*—Harness, Dickey & Pierce, P.L.C.

(57) ABSTRACT

A semiconductor chip includes: a semiconductor substrate; a penetrating electrode which is formed through the semiconductor substrate from a first surface to a second surface of the semiconductor substrate and has a projection which projects from the second surface; an insulating layer formed over an entire surface of the second surface. The insulating layer includes a first insulating section formed in a region around the projection and a second insulating section other than the first insulating section. The second insulating section is formed to be thinner than a thickest area of the first insulating section.

10 Claims, 9 Drawing Sheets

U.S. PATENT DOCUMENTS

| | | | |
|---|---|---|---|
| 2002/0084513 A1* | 7/2002 | Siniaguine | 257/621 |
| 2004/0016942 A1* | 1/2004 | Miyazawa et al. | 257/200 |
| 2004/0048459 A1* | 3/2004 | Patti | 438/612 |
| 2004/0080040 A1* | 4/2004 | Dotta et al. | 257/698 |
| 2004/0137705 A1* | 7/2004 | Nemoto et al. | 438/597 |
| 2004/0142574 A1* | 7/2004 | Miyazawa | 438/694 |
| 2004/0192033 A1* | 9/2004 | Hara | 438/667 |
| 2005/0017338 A1* | 1/2005 | Fukazawa | 257/686 |
| 2005/0051883 A1* | 3/2005 | Fukazawa | 257/686 |
| 2007/0007639 A1* | 1/2007 | Fukazawa | 257/686 |

FOREIGN PATENT DOCUMENTS

| | | |
|---|---|---|
| JP | 10-223833 | 8/1998 |
| JP | 2001-053218 | 2/2001 |
| JP | 2001-203316 | 7/2001 |
| JP | 2002-050738 | 2/2002 |
| KR | 1020010056778 | 7/2001 |
| KR | 2001-0086244 | 9/2001 |
| KR | 1997-0061431 | 9/2002 |

* cited by examiner

SEMICONDUCTOR CHIP, AND SEMICONDUCTOR WAFER INCLUDING A VARIABLE THICKNESS INSULATING LAYER

CROSS-REFERENCE TO RELATED APPLICATIONS

This application claims the benefit of Japanese patent application 2003-007281, filed Jan. 15, 2003. The disclosure of the above application is incorporated herein by reference in its entirety.

BACKGROUND OF THE INVENTION

The present invention relates to a semiconductor chip, a semiconductor wafer, a semiconductor device and a method of manufacturing the same, a circuit board, and an electronic instrument.

A semiconductor device in three-dimensional mounting form has been developed. It is known in the art that penetrating electrodes are formed in semiconductor chips, and the semiconductor chips are stacked to bond the penetrating electrodes. In a conventional structure, a measure to prevent occurrence of short circuits between the stacked semiconductor chips is insufficient. An insulating layer may be formed on the surface of the semiconductor chip on which the penetrating electrodes are formed. In this case, the gap for filling the space between the stacked semiconductor chips with an underfill material is reduced.

BRIEF SUMMARY OF THE INVENTION

A semiconductor chip according to a first aspect of the present invention includes:
a semiconductor substrate;
an integrated circuit, at least a part of the integrated circuit being formed in the semiconductor substrate;
a penetrating electrode which is formed through the semiconductor substrate from a first surface to a second surface of the semiconductor substrate and has a projection which projects from the second surface; and
an insulating layer formed on the second surface except a part of the second surface, and in a region around the projection.

A semiconductor chip according to a second aspect of the present invention includes:
a semiconductor substrate;
an integrated circuit, at least a part of the integrated circuit being formed in the semiconductor substrate;
a penetrating electrode which is formed through the semiconductor substrate from a first surface to a second surface of the semiconductor substrate and has a projection which projects from the second surface;
an insulating layer formed over an entire surface of the second surface,
wherein the insulating layer includes a first insulating section formed in a region around the projection and a second insulating section other than the first insulating section, and
wherein the second insulating section is formed to be thinner than a thickest area of the first insulating section.

A semiconductor chip according to a third aspect of the present invention includes:
a semiconductor substrate;
an integrated circuit, at least a part of the integrated circuit being formed in the semiconductor substrate;
a penetrating electrode which is formed through the semiconductor substrate from a first surface to a second surface of the semiconductor substrate and has a projection which projects from the second surface;
an insulating layer formed on the second surface except a part of the second surface, and in a region around the projection,
wherein the semiconductor substrate is formed so that the second surface rises higher in the region around the projection than in a region other than the region around the projection.

A semiconductor chip according to a fourth aspect of the present invention includes:
a semiconductor substrate;
an integrated circuit, at least a part of the integrated circuit being formed in the semiconductor substrate;
a penetrating electrode which is formed through the semiconductor substrate from a first surface to a second surface of the semiconductor substrate and has a projection which projects from the second surface;
an insulating layer formed over an entire surface of the second surface,
wherein the semiconductor substrate is formed so that the second surface rises higher in a region around the projection than in a region other than the region around the projection, and
wherein the insulating layer is formed so that a surface of the insulating layer rises higher in the region around the projection than in the region other than the region around the projection.

A semiconductor wafer according to fifth aspect of the present invention includes:
a semiconductor substrate;
a plurality of integrated circuits, at least a part of each of the integrated circuits being formed in the semiconductor substrate;
a plurality of penetrating electrodes, each of the penetrating electrodes being formed through the semiconductor substrate from a first surface to a second surface of the semiconductor substrate and having a projection which projects from the second surface; and
a plurality of insulating layers, each of the insulating layers being formed on the second surface except a part of the second surface, and in a region around the projection.

A semiconductor wafer according to a sixth aspect of the present invention includes:
a semiconductor substrate;
a plurality of integrated circuits, at least a part of each of the integrated circuits being formed in the semiconductor substrate;
a plurality of penetrating electrodes, each of the penetrating electrodes being formed through the semiconductor substrate from a first surface to a second surface of the semiconductor substrate and having a projection which projects from the second surface;
an insulating layer formed over an entire surface of the second surface,
wherein the insulating layer includes a plurality of first insulating sections and a second insulating section other than the first insulating sections, each of the first insulating sections being formed in a region around the projection, and
wherein the second insulating section is formed to be thinner than a thickest area of each of the first insulating sections.

A semiconductor wafer according to a seventh aspect of the present invention includes:
a semiconductor substrate;

a plurality of integrated circuits, at least a part of each of the integrated circuits being formed in the semiconductor substrate;

a plurality of penetrating electrodes, each of the penetrating electrodes being formed through the semiconductor substrate from a first surface to a second surface of the semiconductor substrate and having a projection which projects from the second surface; and a plurality of insulating layers, each of the insulating layers being formed on the second surface except a part of the second surface, and in a region around the projection, wherein the semiconductor substrate is formed so that the second surface rises higher in the region around the projection than in a region other than the region around the projection.

A semiconductor wafer according to an eighth aspect of the present invention includes:

a semiconductor substrate;

a plurality of integrated circuits, at least a part of each of the integrated circuits being formed in the semiconductor substrate;

a plurality of penetrating electrodes, each of the penetrating electrodes being formed through the semiconductor substrate from a first surface to a second surface of the semiconductor substrate and having a projection which projects from the second surface;

an insulating layer formed over an entire surface of the second surface, wherein the semiconductor substrate is formed so that the second surface rises higher in a region around the projection than in a region other than the region around the projection, and wherein the insulating layer is formed so that a surface of the insulating layer rises higher in the region around the projection than in the region other than the region around the projection.

A semiconductor device according to a ninth aspect of the present invention includes any one of the above semiconductor chips, the semiconductor chips being stacked, and two adjacent semiconductor chips among the stacked semiconductor chips are electrically connected through the penetrating electrodes.

A circuit board according to a tenth aspect of the present invention has any one of the above semiconductor chips mounted thereon.

A circuit board according to an eleventh aspect of the present invention has any one of the above semiconductor devices mounted thereon.

An electronic instrument according to a twelfth aspect of the present invention has any one of the above semiconductor chips.

An electronic instrument according to a thirteenth aspect of the present invention has any one of the above semiconductor devices.

A method of manufacturing semiconductor device according to a fourteenth aspect of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer on the second surface except a part of the second surface, and in a region around the projection.

A method of manufacturing semiconductor device according to a fifteenth aspect of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer over an entire surface of the second surface so that the insulating layer includes a first insulating section formed in a region around the projection and a second insulating section other than the first insulating section, and the second insulating section is thinner than a thickest area of the first insulating section.

A method of manufacturing semiconductor device according to a sixteenth aspect of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer on the second surface except a part of the second surface, and in a region around the projection, wherein the semiconductor substrate is formed so that the second surface rises higher in the region around the projection than in a region other than the region around the projection.

A method of manufacturing semiconductor device according to a seventeenth aspect of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer over an entire surface of the second surface, wherein the semiconductor substrate is formed so that the second surface rises higher in the region around the projection than in a region other than the region around the projection, and wherein the insulating layer is formed so that a surface of the insulating layer rises higher in the region around the projection than in the region other than the region around the projection.

DETAILED DESCRIPTION OF THE EMBODIMENTS

Figure 1A:
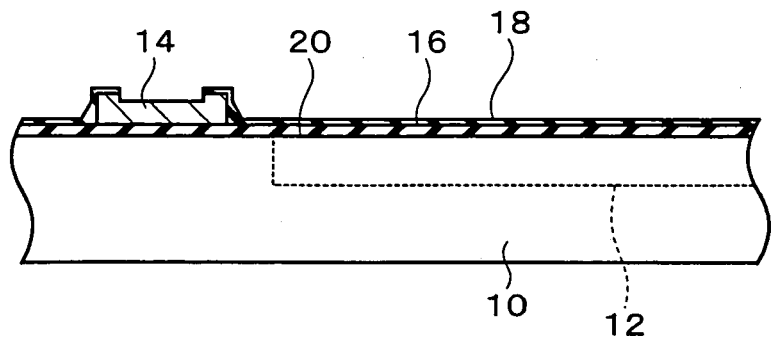
FIGS. 1A to 1D illustrate a method of manufacturing a semiconductor device according to an embodiment of the present invention.
Figure 1B:
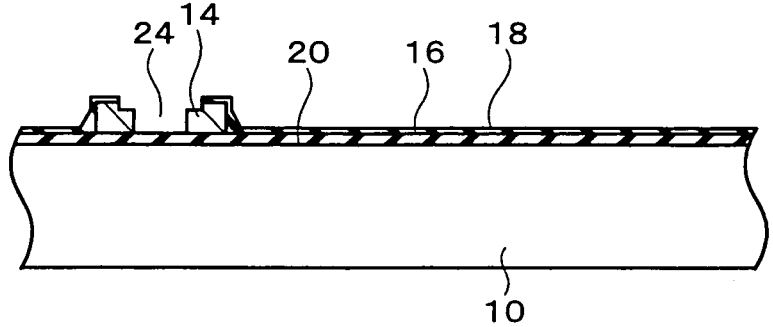

Embodiments of the present invention may prevent occurrence of short circuits by forming an insulating layer in a region around a terminal while sufficiently securing the gap between stacked semiconductor chips, and may improve filling capability of an underfill by sufficiently securing the gap.

(1) A semiconductor chip according to a first embodiment of the present invention includes:

a semiconductor substrate;

an integrated circuit, at least a part of the integrated circuit being formed in the semiconductor substrate;

a penetrating electrode which is formed through the semiconductor substrate from a first surface to a second surface of the semiconductor substrate and has a projection which projects from the second surface; and an insulating layer formed on the second surface except a part of the second surface, and in a region around the projection.

According to this semiconductor chip, since the insulating layer is formed in the region around the projection of the penetrating electrode except the region other than the region around the projection, occurrence of short circuits can be prevented by sufficiently securing the gap between stacked semiconductor chips. Moreover, filling capability of an underfill can be improved by sufficiently securing the gap between stacked semiconductor chips.

(2) With this semiconductor chip, the insulating layer may be formed so that a thickness of the insulating layer decreases as a distance from the projection increases.

(3) A semiconductor chip according to a second embodiment of the present invention includes:

a semiconductor substrate;

an integrated circuit, at least a part of the integrated circuit being formed in the semiconductor substrate;

a penetrating electrode which is formed through the semiconductor substrate from a first surface to a second surface of the semiconductor substrate and has a projection which projects from the second surface;

an insulating layer formed over an entire surface of the second surface, wherein the insulating layer includes a first insulating section formed in a region around the projection and a second insulating section other than the first insulating section, and wherein the second insulating section is formed to be thinner than a thickest area of the first insulating section.

According to this semiconductor chip, since the second insulating section is formed to be thinner than the thickest area of the first insulating section, occurrence of short circuits can be prevented by sufficiently securing the gap between stacked semiconductor chips. Moreover, filling capability of an underfill can be improved by sufficiently securing the gap between stacked semiconductor chips.

(4) With this semiconductor chip, the first insulating section may be formed so that a thickness of the first insulating section decreases as a distance from the projection increases.

(5) A semiconductor chip according to a third embodiment of the present invention includes:

a semiconductor substrate;

an integrated circuit, at least a part of the integrated circuit being formed in the semiconductor substrate;

a penetrating electrode which is formed through the semiconductor substrate from a first surface to a second surface of the semiconductor substrate and has a projection which projects from the second surface;

an insulating layer formed on the second surface except a part of the second surface, and in a region around the projection, wherein the semiconductor substrate is formed so that the second surface rises higher in the region around the projection than in a region other than the region around the projection.

According to this semiconductor chip, since the second surface is formed to rise higher in the region around the projection than in the region other than the region around the projection, occurrence of short circuits can be prevented by sufficiently securing the gap between stacked semiconductor chips. Moreover, filling capability of an underfill can be improved by sufficiently securing the gap between stacked semiconductor chips.

(6) A semiconductor chip according to a fourth embodiment of the present invention includes:

a semiconductor substrate;

an integrated circuit, at least a part of the integrated circuit being formed in the semiconductor substrate;

a penetrating electrode which is formed through the semiconductor substrate from a first surface to a second surface of the semiconductor substrate and has a projection which projects from the second surface;

an insulating layer formed over an entire surface of the second surface, wherein the semiconductor substrate is formed so that the second surface rises higher in a region around the projection than in a region other than the region around the projection, and wherein the insulating layer is formed so that a surface of the insulating layer rises higher in the region around the projection than in the region other than the region around the projection.

According to this semiconductor chip, since the surface of the insulating layer is formed to rise higher in the region around the projection than in the region other than the region around the projection, occurrence of short circuits can be prevented by sufficiently securing the gap between stacked semiconductor chips. Moreover, filling capability of an underfill can be improved by sufficiently securing the gap between stacked semiconductor chips.

(7) With this semiconductor chip, the projection may be formed to have a height higher than a height of a thickest area of the insulating layer.

(8) With this semiconductor chip, the projection may be formed to have a height equal to a height of a thickest area of the insulating layer.

(9) A semiconductor wafer according to a fifth embodiment of the present invention includes:

a semiconductor substrate;

a plurality of integrated circuits, at least a part of each of the integrated circuits being formed in the semiconductor substrate;

a plurality of penetrating electrodes, each of the penetrating electrodes being formed through the semiconductor substrate from a first surface to a second surface of the semiconductor substrate and having a projection which projects from the second surface; and a plurality of insulating layers, each of the insulating layers being formed on the second surface except a part of the second surface, and in a region around the projection.

According to this semiconductor wafer, since the insulating layer is formed in the region around the projection of the penetrating electrode except the region other than the region around the projection, occurrence of short circuits can be prevented by sufficiently securing the gap between stacked semiconductor chips. Moreover, filling capability of an underfill can be improved by sufficiently securing the gap between stacked-semiconductor chips.

(10) With this semiconductor wafer, each of the insulating layers may be formed so that a thickness of each of the insulating layers decreases as a distance from the projection increases.

(11) A semiconductor wafer according to a sixth embodiment of the present invention includes:

a semiconductor substrate;

a plurality of integrated circuits, at least a part of each of the integrated circuits being formed in the semiconductor substrate;

a plurality of penetrating electrodes, each of the penetrating electrodes being formed through the semiconductor substrate from a first surface to a second surface of the semiconductor substrate and having a projection which projects from the second surface;

an insulating layer formed over an entire surface of the second surface, wherein the insulating layer includes a plurality of first insulating sections and a second insulating section other than the first insulating sections, each of the first insulating sections being formed in a region around the projection, and wherein the second insulating section is formed to be thinner than a thickest area of each of the first insulating sections.

According to this semiconductor wafer, since the second insulating section is formed to be thinner than the thickest area of the first insulating section, occurrence of short circuits can be prevented by sufficiently securing the gap between stacked semiconductor chips. Moreover, filling capability of an underfill can be improved by sufficiently securing the gap between stacked semiconductor chips.

(12) With this semiconductor wafer, each of the first insulating sections may be formed so that a thickness of each of the first insulating sections decreases as a distance from the projection increases.

(13) A semiconductor wafer according to a seventh embodiment of the present invention includes:

a semiconductor substrate;

a plurality of integrated circuits, at least a part of each of the integrated circuits being formed in the semiconductor substrate;

a plurality of penetrating electrodes, each of the penetrating electrodes being formed through the semiconductor substrate from a first surface to a second surface of the semiconductor substrate and having a projection which projects from the second surface; and a plurality of insulating layers, each of the insulating layers being formed on the second surface except a part of the second surface, and in a region around the projection, wherein the semiconductor substrate is formed so that the second surface rises higher in the region around the projection than in a region other than the region around the projection.

According to this semiconductor wafer, since the second surface is formed to rise higher in the region around the projection than in the region other than the region around the projection, occurrence of short circuits can be prevented by sufficiently securing the gap between stacked semiconductor chips. Moreover, filling capability of an underfill can be improved by sufficiently securing the gap between stacked semiconductor chips.

(14) A semiconductor wafer according to an eighth embodiment of the present invention includes:

a semiconductor substrate;

a plurality of integrated circuits, at least a part of each of the integrated circuits being formed in the semiconductor substrate;

a plurality of penetrating electrodes, each of the penetrating electrodes being formed through the semiconductor substrate from a first surface to a second surface of the semiconductor substrate and having a projection which projects from the second surface;

an insulating layer formed over an entire surface of the second surface, wherein the semiconductor substrate is formed so that the second surface rises higher in a region around the projection than in a region other than the region around the projection, and wherein the insulating layer is formed so that a surface of the insulating layer rises higher in the region around the projection than in the region other than the region around the projection.

According to this semiconductor wafer, since the surface of the insulating layer is formed to rise higher in the region around the projection than in the region other than the region around the projection, occurrence of short circuits can be prevented by sufficiently securing the gap between stacked semiconductor chips. Moreover, filling capability of an underfill can be improved by sufficiently securing the gap between stacked semiconductor chips.

(15) With this semiconductor wafer, the projection may be formed to have a height higher than a height of a thickest area of the insulating layer.

(16) With this semiconductor wafer, the projection may be formed to have a height equal to a height of a thickest area of the insulating layer.

(17) A semiconductor device according to a ninth embodiment of the present invention includes:

a plurality of any one of the above semiconductor chips, the semiconductor chips being stacked, wherein two adjacent semiconductor chips among the stacked semiconductor chips are electrically connected through the penetrating electrodes.

(18) A circuit board according to a tenth embodiment of the present invention has any one of the above semiconductor chips mounted thereon.

(19) A circuit board according to an eleventh embodiment of the present invention has any one of the above semiconductor devices mounted thereon.

(20) An electronic instrument according to a twelfth embodiment of the present invention has any one of the above semiconductor chips.

(21) An electronic instrument according to a thirteenth embodiment of the present invention has any one of the above semiconductor devices.

(22) A method of manufacturing a semiconductor device according to a fourteenth embodiment of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer on the second surface except a part of the second surface, and in a region around the projection.

According to this method of manufacturing a semiconductor device, since the insulating layer is formed in the region around the projection of the penetrating electrode except the region other than the region around the projection, occurrence of short circuits can be prevented by sufficiently securing the gap between the stacked semiconductor chips. Moreover, filling capability of an underfill can be improved by sufficiently securing the gap between the stacked semiconductor chips.

(23) With this method of manufacturing a semiconductor device, the insulating layer may be formed so that a thickness of the insulating layer decreases as a distance from the projection increases.

(24) A method of manufacturing a semiconductor device according to a fifteenth embodiment of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer over an entire surface of the second surface so that the insulating layer includes a first insulating section formed in a region around the projection and a second insulating section other than the first insulating section, and the second insulating section is thinner than a thickest area of the first insulating section.

According to this method of manufacturing a semiconductor device, since the second insulating section is formed to be thinner than the thickest area of the first insulating section, occurrence of short circuits can be prevented by sufficiently securing the gap between the stacked semiconductor chips. Moreover, filling capability of an underfill can be improved by sufficiently securing the gap between the stacked semiconductor chips.

(25) With this method of manufacturing a semiconductor device, the first insulating section may be formed so that a thickness of the first insulating section decreases as a distance from the projection increases.

(26) A method of manufacturing a semiconductor device according to a sixteenth embodiment of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer on the second surface except a part of the second surface, and in a region around the projection, wherein the semiconductor substrate is formed so that the second surface rises higher in the region around the projection than in a region other than the region around the projection.

According to this method of manufacturing a semiconductor device, since the second surface is formed to rise higher in the region around the projection than in the region other than the region around the projection, occurrence of short circuits can be prevented by sufficiently securing the gap between the stacked semiconductor chips. Moreover, filling capability of an underfill can be improved by sufficiently securing the gap between the stacked semiconductor chips.

(27) A method of manufacturing a semiconductor device according to a seventeenth embodiment of the present invention includes:

(a) forming a penetrating electrode in a semiconductor substrate in which at least a part of an integrated circuit is formed, the penetrating electrode being formed through the semiconductor substrate from a first surface and a second surface of the semiconductor substrate and having a projection which projects from the second surface; and (b) forming an insulating layer over an entire surface of the second surface, wherein the semiconductor substrate is formed so that the second surface rises higher in the region around the projection than in a region other than the region around the projection, and wherein the insulating layer is formed so that a surface of the insulating layer rises higher in the region around the projection than in the region other than the region around the projection.

According to this method of manufacturing a semiconductor device, since the surface of the insulating layer is formed to rise higher in the region around the projection than in the region other than the region around the projection, occurrence of short circuits can be prevented by sufficiently securing the gap between the stacked semiconductor chips. Moreover, filling capability of an underfill can be improved by sufficiently securing the gap between the stacked semiconductor chips.

(28) With this method of manufacturing a semiconductor device, the insulating layer may be formed so that a height of a thickest area of the insulating layer is lower than a height of the projection.

(29) With this method of manufacturing a semiconductor device, the insulating layer may be formed so that a height of a thickest area of the insulating layer is equal to a height of the projection.

(30) This method of manufacturing a semiconductor device, may further include:

forming a plurality of the integrated circuits in the semiconductor substrate, and forming the penetrating electrode for each of the integrated circuits; and cutting the semiconductor substrate.

(31) This method of manufacturing a semiconductor device, may further include:

stacking a plurality of the semiconductor substrates for which the steps (a) and (b) have been implemented; and electrically connecting two adjacent semiconductor substrates among the stacked semiconductor substrates through the penetrating electrodes.

The embodiments of the present invention are described below with reference to the drawings.

FIG. 1A to FIG. 4 illustrate a method of manufacturing a semiconductor device according to an embodiment to which the present invention is applied. In the present embodiment, a semiconductor substrate 10 is used. At least a part (part or the entirety) of an integrated circuit 12 (circuit including a transistor or memory, for example) is formed in the semiconductor substrate 10. At least a part of each of a plurality of integrated circuits 12 may be formed in the semiconductor substrate 10, or at least a part of one integrated circuit 12 may be formed in the semiconductor substrate 10. A plurality of electrodes 14 (pads, for example) are formed on the semiconductor substrate 10. The electrode 14 is electrically connected with the integrated circuit 12. The electrode 14 may be formed of aluminum. The shape of the surface of the electrode 14 is not limited. The shape of the surface of the electrode 14 is generally quadrilateral.

One or more layers of passivation films 16 and 18 are formed on the semiconductor substrate 10. The passivation films 16 and 18 may be formed of $SiO_2$, SiN, or a polyimide resin, for example. In the example shown in FIG. 1A, the electrode 14 and an interconnect (not shown) which connects the integrated circuit 12 with the electrode 14 are formed on the passivation film 16. The passivation film 18 is formed to avoid at least a part of the surface of the electrode 14. The passivation film 18 may be formed to cover the surface of the electrode 14, and a part of the electrode 14 may be exposed by etching a part of the passivation film 18. The passivation film 18 may be etched by either dry etching or wet etching. The surface of the electrode 14 may be etched when etching the passivation film 18.

In the present embodiment, a recess section 22 (see FIG. 1C) is formed in the semiconductor substrate 10 from a first surface 20. The first surface 20 is the surface on the side on which the electrode 14 is formed (on the side on which the integrated circuit 12 is formed). The recess section 22 is formed to avoid devices and interconnects of the integrated circuit 12. As shown in FIG. B, a through-hole 24 may be formed through the electrode 14. The through-hole 24 may be formed by etching (dry etching or wet etching). The electrode 14 may be etched after forming a resist (not shown) patterned by using a lithographic step. In the case where the passivation film 16 is formed under the electrode 14, a through-hole 26 (see FIG. 1C) is formed through the passivation film 16. In the case where etching of the electrode 14 stops at the passivation film 16, the through-hole 26 may be formed by using an etchant differing from the etchant used to etch the electrode 14. In this case, a resist (not shown) patterned by using a lithographic step may be formed.

Figure 1C:
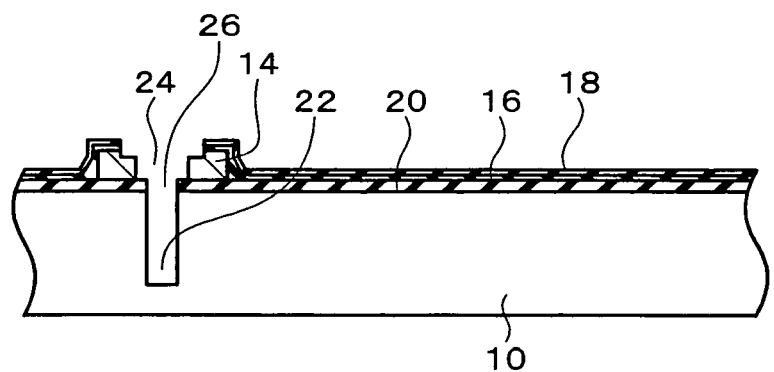

As shown in FIG. 1C, the recess section 22 is formed in the semiconductor substrate 10 so as to be connected with the through-hole 24 (and the through-hole 26). The through-hole 24 (and the through-hole 26) and the recess section 22 may be collectively referred to as a recess section. The recess section 22 may be formed by etching (dry etching or wet etching). The semiconductor substrate 10 may be etched after forming a resist (not shown) patterned by using a lithographic step. A laser ($CO_2$ laser or YAG laser, for example) may be used to form the recess section 22. A laser may be used to form the through-holes 24 and 26. The recess section 22 and the through-holes 24 and 26 may be continuously formed by using one type of etchant or laser. A sand blasting processing may be used to form the recess section 22.

Figure 1D:
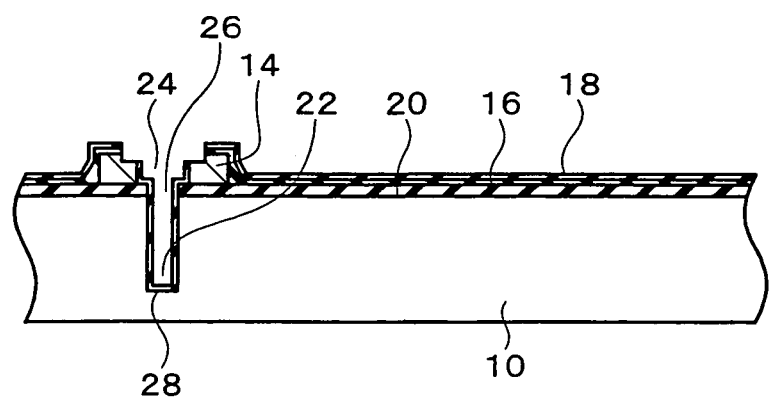

As shown in FIG. 1D, an insulating layer 28 may be formed inside the recess section 22. The insulating layer 28 may be an oxide film. In the case where the semiconductor substrate 10 is formed of Si, the insulating layer 28 may be formed of $SiO_2$ or SiN. The insulating layer 28 is formed on the bottom surface of the recess section 22. The insulating layer 28 is also formed on the inner wall surface of the recess section 22. The insulating layer 28 is formed so that the recess section 22 is not filled with the insulating layer 28. Specifically, a recess section is formed by the insulating layer 28. The insulating layer 28 may be formed on the inner wall surface of the through-hole 26 formed in the passivation film 16. The insulating layer 28 may be formed on the passivation film 18.

The insulating layer 28 may be formed on the inner wall surface of the through-hole 24 formed in the electrode 14. The insulating layer 28 is formed to avoid a part (upper surface, for example) of the electrode 14. The insulating layer 28 may be formed to cover the entire surface of the electrode 14, and a part of the electrode 14 may be exposed by etching (dry etching or wet etching) a part of the insulating layer 28. The insulating layer 28 may be etched after forming a resist (not shown) patterned by using a lithographic step.

Figure 2A:
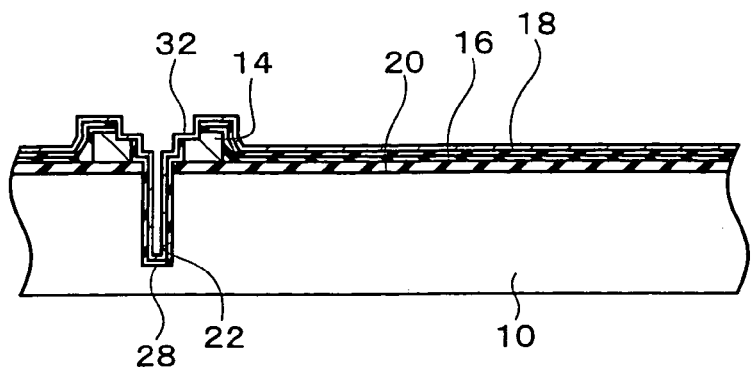
FIGS. 2A to 2D further illustrate the method of manufacturing a semiconductor device according to an embodiment of the present invention.

A conductive section 30 (see FIG. 2B) is formed in the recess section 22 (inside the insulating layer 28, for example). The conductive section 30 may be formed of Cu, W, or the like. After forming an outer layer section 32 of the conductive section 30 as shown in FIG. 2A, a center section 34 of the conductive section 30 may be formed. The center section 34 may be formed of Cu, W, or doped polysilicon (low-temperature polysilicon, for example). The outer layer section 32 may include at least a barrier layer. The barrier layer prevents a material for the center section 34 or a seed layer described below from diffusing into the semiconductor substrate 10 (Si, for example). The barrier layer may be formed of a material differing from the material for the center section 34 (TiW or TiN, for example). In the case of forming the center section 34 by electroplating, the outer layer section 32 may include a seed layer. The seed layer is formed after forming the barrier layer. The seed layer is formed of the same material as the material for the center section 34 (Cu, for example). The conductive section 30 (at least the center section 34) may be formed by electroless plating or using an ink-jet method.

Figure 2B:
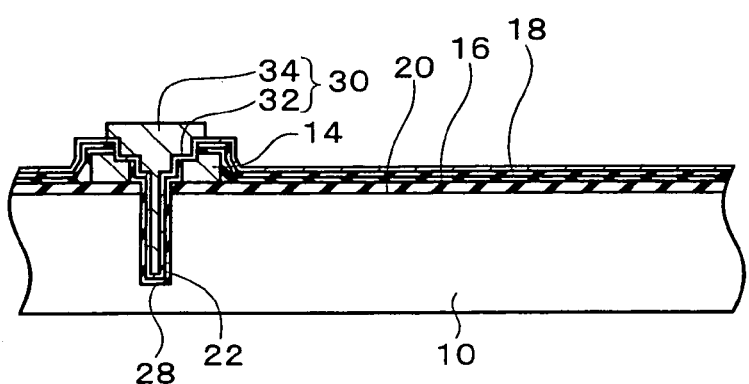
Figure 2C:
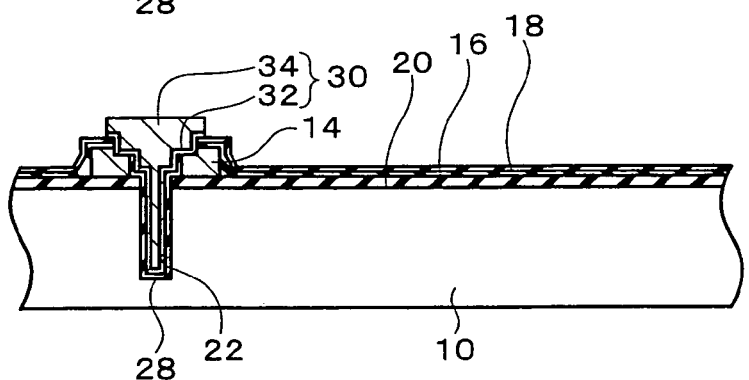

In the case where the outer layer section 32 is also formed on the passivation film 18 as shown in FIG. 2B, the outer layer section 32 is etched in the area formed on the passivation film 18 as shown in FIG. 2C. The conductive section 30 can be formed by forming the center section 34 after forming the outer layer section 32. A part of the conductive section 30 is located inside the recess section 22 in the semiconductor substrate 10. Since the insulating layer 28 is present between the inner wall surface of the recess section 22 and the conductive section 30, the inner wall surface of the recess section 22 is not electrically connected with the conductive section 30. The conductive section 30 is electrically connected with the electrode 14. The conductive section 30 may be in contact with the section of the electrode 14 exposed from the insulating layer 28, for example. A part of the conductive section 30 may be located on the passivation film 18. The conductive section 30 may be formed only inside the region of the electrode 14. The conductive section 30 may project over at least the recess section 22. The conductive section 30 may project higher than the passivation film 18, for example.

As a modification, the center section 34 may be formed in a state in which the outer layer section 32 remains on the passivation film 18. In this case, since a layer continuous with the center section 34 is also formed on the passivation film 18, this layer is etched.

Figure 2D:
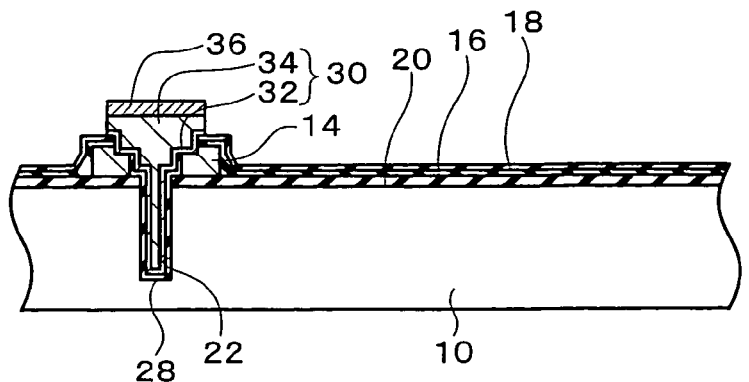

As shown in FIG. 2D, a filler metal 36 may be formed on the conductive section 30. The filler metal 36 is formed of solder, for example. The filler metal 36 may be formed of either soft solder or hard solder. The filler metal 36 may be formed while covering the region other than the conductive section 30 with a resist. A bump can be formed by the conductive section 30 or by the conductive section 30 and the filler metal 36 by these steps.

Figure 3A:
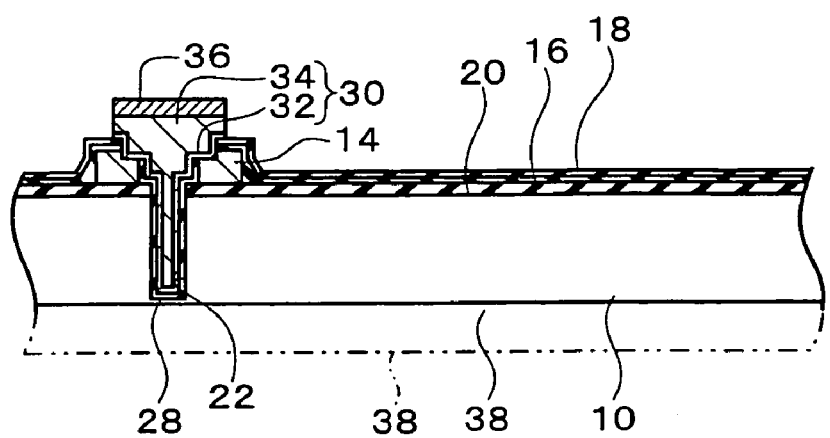
FIGS. 3A and 3B further illustrate the method of manufacturing a semiconductor device according to an embodiment of the present invention.

In the present embodiment, a second surface 38 (surface opposite to the first surface 20) of the semiconductor substrate 10 may be removed as shown in FIG. 3A by at least one of mechanical polishing/grinding and chemical polishing/grinding. This step is terminated before the insulating layer 28 formed in the recess section 22 is exposed. A step shown in FIG. 3B may be performed without performing the step shown in FIG. 3A.

Figure 3B:
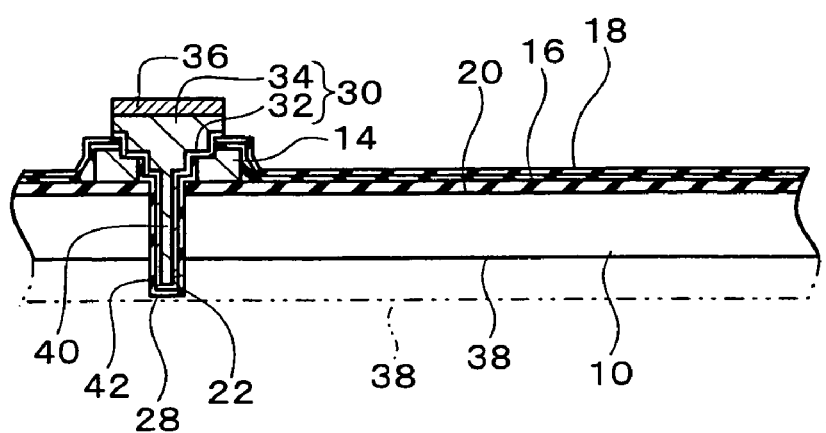

As shown in FIG. 3B, the conductive section 30 is caused to project from the second surface 38. For example, the second surface 38 of the semiconductor substrate 10 is etched so that the insulating layer 28 is exposed. In more detail, the second surface 38 of the semiconductor substrate 10 is etched so that the conductive section 30 projects in a state in which the conductive section 30 (section inside the recess section 22 in more detail) is covered with the insulating layer 28. The second surface 38 may be etched by using an etchant having properties which allow the amount of etching for the semiconductor substrate 10 (Si, for example) to be greater than the amount of etching for the insulating layer 28 ($SiO_2$, for example). The etchant may be $SF_6$, $CF_4$, or $Cl_2$ gas. Etching may be performed by using a dry etching system. The etchant may be a mixed solution of hydrofluoric acid and nitric acid or a mixed solution of hydrofluoric acid, nitric acid, and acetic acid.

At least one of the steps shown in FIGS. 3A and 3B may be performed in a state in which a reinforcement material such as a glass plate, resin layer, or resin tape is provided (attached) to the first surface 20 of the semiconductor substrate 10 (using an adhesive or adhesive sheet), for example.

The conductive section 30 is caused to project from the second surface 38 of the semiconductor substrate 10 by these steps. Specifically, a penetrating electrode 40 having a projection 42 which projects from the second surface 38 is formed. The penetrating electrode 40 is formed through the first and second surfaces 20 and 38.

Figure 4:
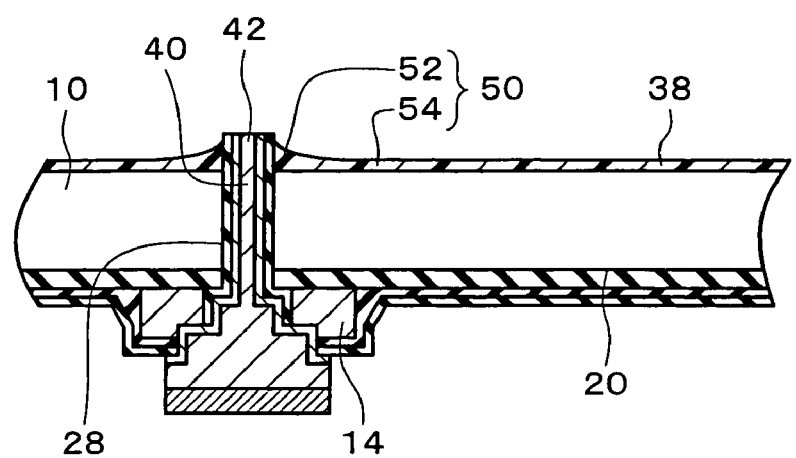
FIG. 4 further illustrates the method of manufacturing a semiconductor device according to an embodiment of the present invention.

As shown in FIG. 4, an insulating layer 50 is formed on the second surface 38. In the present embodiment, the insulating layer 50 is formed over the entire second surface 38. The insulating layer 50 is formed to include first and second insulating sections 52 and 54.

The first insulating section 52 is formed in a surrounding region of the projection 42. The surrounding region is a region around the projection 42. The surrounding region is a region having a width from the side surface of the projection 42 of about 5 to 100% of the height of the projection 42 from the second surface 38. The description of the surrounding region also applies to other examples. The first insulating section 52 may adhere to the side surface of the projection 42. The first insulating section 52 may be formed to be thinner as the distance from the projection 42 increases. The first insulating section 52 is formed to avoid the end face of the projection 42. For example, the first insulating section 52 may be formed to have a thickness which allows the height of the surface of the area in contact with the side surface of the projection 42 to be equal to or lower than the height of the end face of the projection 42. The second insulating section 54 is the section of the insulating layer 50 other than the first insulating section 52. The second insulating section 54 is formed to be thinner than the thickest area of the first insulating section 52. The second insulating section 54 may be formed to be thinner than the thinnest area of the first insulating section 52.

The insulating layer 50 may be formed of a resin. The insulating layer 50 may be formed by using a spin coater or by potting or printing. The insulating layer 50 may be formed in the shape differing from the shapes of the first and second insulating sections 52 and 54 (flatly, for example), and the first and second insulating sections 52 and 54 may be formed by etching the insulating layer 50. In this case, an etchant may be used for etching. As the etchant, a solution having a higher etching rate for the resin which makes up the insulating layer 50 than for the penetrating electrode 40 (and the insulating layer 28 which surrounds the penetrating electrode 40) is used. The region around the projection 42 is etched to only a small extent due to the presence of the projection 42, whereby the first and second insulating sections 52 and 54 are formed. The insulating layer 50 may be formed to include the first and second insulating sections 52 and 54 by potting, printing, or the like.

According to the present embodiment, since the second insulating section 54 is formed to be thinner than the thickest area of the first insulating section 52, occurrence of short circuits can be prevented by sufficiently securing the gap between stacked semiconductor chips. Moreover, filling capability of an underfill can be improved by sufficiently securing the gap between stacked semiconductor chips.

Figure 5:
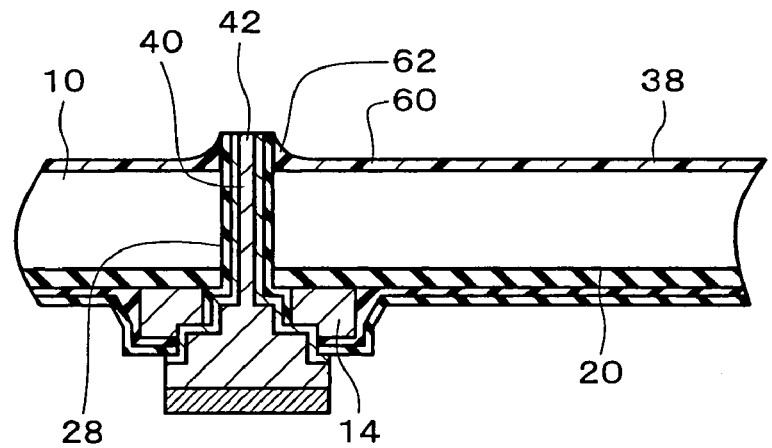
FIG. 5 illustrates a first modification of an embodiment of the present invention.

FIG. 5 shows a first modification of the above embodiment. The insulating layer 50 is formed so that the thickest area of the insulating layer 50 (contact area of the first insulating section 52 with the projection 42) is lower than the projection 42. Specifically, the projection 42 is formed to have a height exceeding the height of the thickest area of the insulating layer 50. An insulating layer 60 shown in FIG. 5 is formed so that the thickest area of the insulating layer 60 (contact area of a first insulating section 62 with the projection 42) has the same height as the height of the projection 42. Specifically, the projection 42 is formed to have the same height as the height of the thickest area of the insulating layer 60. The description in the above embodiment applies to the rest of the details.

Figure 6:
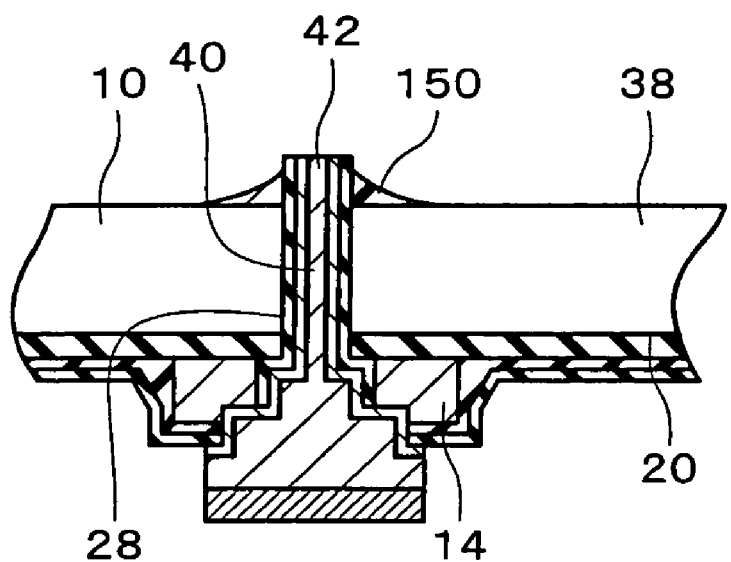
FIG. 6 illustrates a second modification of an embodiment of the present invention.

FIG. 6 shows a second modification of the above embodiment. In the example shown in FIG. 6, an insulating layer 150 is formed in the region around the projection 42 (only in the surrounding region, for example). The details of the surrounding region are the same as described above. The insulating layer 150 may be formed to be thinner as the distance from the projection 42 increases. The insulating layer 150 is not formed over the entire surface of the second surface 38 so as to avoid a part of the second surface 38. The insulating layer 150 is formed so that the thickest area of the insulating layer 150 (contact area with the projection 42) is lower than the projection 42. Specifically, the projection 42 is formed to have a height exceeding the height of the thickest area of the insulating layer 50. The description of the first insulating section 52 shown in FIG. 4 may be applied to the insulating layer 150. According to this modification, since the insulating layer 150 is formed in the region around the projection 42 of the penetrating electrode 40 so as to avoid the region other than the surrounding region, occurrence of short circuits can be prevented by sufficiently securing the gap between stacked semiconductor chips. Moreover, filling capability of an underfill can be improved by sufficiently securing the gap between stacked semiconductor chips. The description in the above embodiment applies to the rest of the details.

Figure 7:
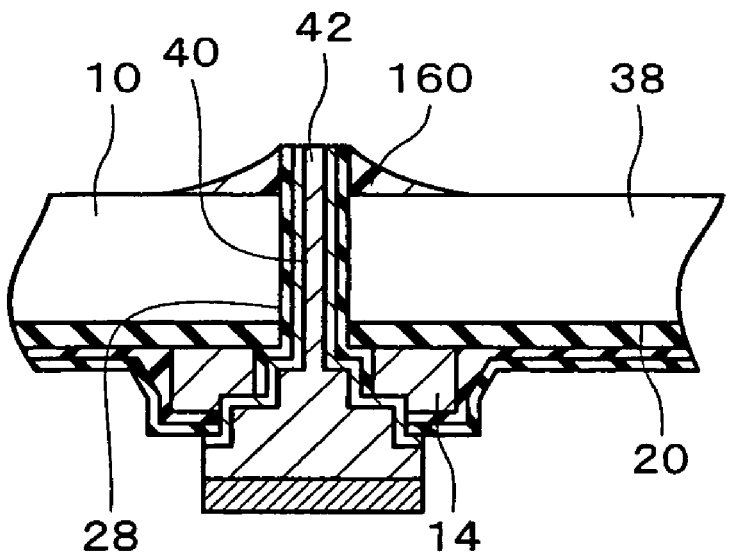
FIG. 7 illustrates a third modification of an embodiment of the present invention.

FIG. 7 shows a third modification of the above embodiment. In the example shown in FIG. 7, an insulating layer 160 is formed in the region around the projection 42 (only in the surrounding region, for example). The details of the surrounding region are the same as described above. The insulating layer 160 may be formed to be thinner as the distance from the projection 42 increases. The insulating layer 160 is not formed over the entire second surface 38 so as to avoid a part of the second surface 38. The insulating layer 160 is formed so that the thickest area of the insulating layer 160 (contact area with the projection 42) has the same height as the height of the projection 42. Specifically, the projection 42 is formed to have the same height as the height of the thickest area of the insulating layer 160. The description of the first insulating section 52 shown in FIG. 4 may be applied to the insulating layer 160. According to this modification, since the insulating layer 160 is formed in the region around the projection 42 of the penetrating electrode 40 so as to avoid the region other than the surrounding region, occurrence of short circuits can be prevented by sufficiently securing the gap between stacked semiconductor chips. Moreover, filling capability of an underfill can be improved by sufficiently securing the gap between stacked semiconductor chips. The description in the above embodiment applies to the rest of the details.

Figure 8:
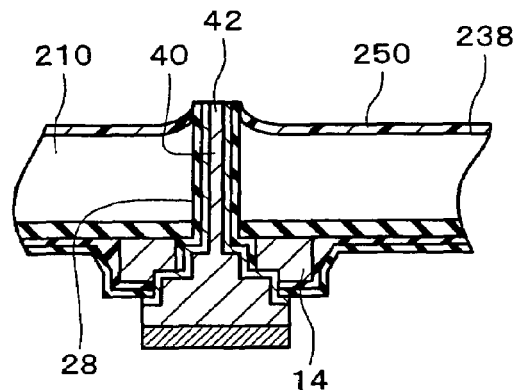
FIG. 8 illustrates a fourth modification of an embodiment of the present invention.

FIG. 8 shows a fourth modification of the above embodiment. In the example shown in FIG. 8, a semiconductor substrate 210 is formed so that a second surface 238 rises higher in the region around the projection 42 (details are the same as described above) than in the region other than the surrounding region. The shape of the second surface 238 may be formed by allowing the etching rate to be decreased in the region around the projection 42 when etching the second surface 238. An insulating layer 250 is formed on the second surface 238. The insulating layer 250 may be formed over the entire second surface 238. The insulating layer 250 is formed so that the surface of the insulating layer 250 rises higher in the region around the projection 42 than in the region other than the surrounding region. The shape of the surface of the insulating layer 250 may correspond to the shape of the surface of the second surface 238. The description of the insulating layer 50 shown in FIG. 4 or the insulating layer 60 shown in FIG. 5 may be applied to the insulating layer 250. According to this modification, since the insulating layer 250 is formed so that the surface of the insulating layer 250 is formed to rise higher in the region around the projection 42 than in the region other than the surrounding region, occurrence of short circuits can be prevented by sufficiently securing the gap between stacked semiconductor chips. Moreover, filling capability of an underfill can be improved by sufficiently securing the gap between stacked semiconductor chips. The description in the above embodiment applies to the rest of the details.

Figure 9:
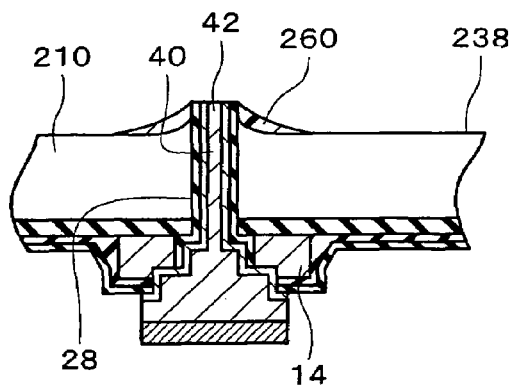
FIG. 9 illustrates a fifth modification of an embodiment of the present invention.

FIG. 9 shows a fifth modification of the above embodiment. In the example shown in FIG. 9, the semiconductor substrate 210 described in the fourth modification is used. An insulating layer 260 is formed on the second surface 238. The insulating layer 260 is formed in the region around the projection 42 (only in the surrounding region, for example). The insulating layer 260 is formed to avoid a part of the second surface 238 (region other than the surrounding region). The description of the insulating layer 150 shown in FIG. 6 or the insulating layer 160 shown in FIG. 7 may be applied to the insulating layer 260. According to this modification, since the region around the projection 42 is formed to rise higher than the region other than the surrounding region on the second surface 238, occurrence of short circuits can be prevented by sufficiently securing the gap between stacked semiconductor chips. Moreover, filling capability of an underfill can be improved by sufficiently securing the gap between stacked semiconductor chips. The description in the above embodiment applies to the rest of the details.

Figure 10:
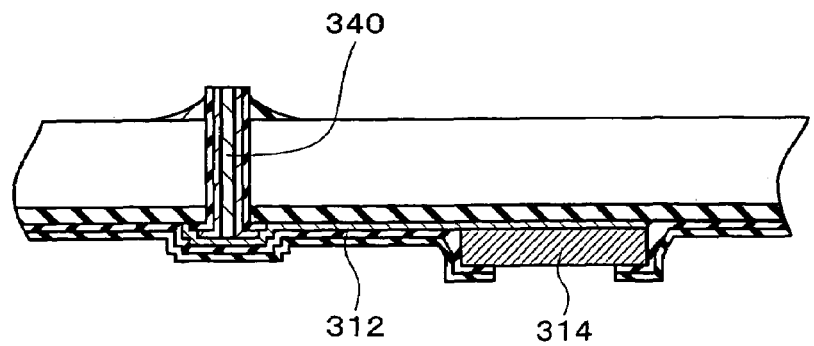
FIG. 10 illustrates a sixth modification of an embodiment of the present invention.

FIG. 10 shows a sixth modification of the above embodiment. In the above embodiment, the penetrating electrode 40 is formed inside the region of the electrode 14. In the example shown in FIG. 10, a penetrating electrode 340 is formed outside the region of an electrode 314. The electrode 314 is electrically connected with the penetrating electrode 340 through an interconnect 312. The description in the above embodiment or the first to fifth modifications may be applied to the other structure.

The embodiment shown in FIG. 4 is described below. The following description may be replaced by the description in the above-described modification. In the case of forming the first and second insulating sections 52 and 54 by etching, the insulating layer 50 may be formed to cover the end face of the projection 42, and the insulating layer 50 may be etched. In this case, the insulating layer 50 may be ground or polished before etching. The penetrating electrode 40 may be ground or polished continuously with or separately from grinding or polishing of the insulating layer 50. The insulating layer 50 may be formed in a state in which the penetrating electrode 40 is covered with the insulating layer 28 (see FIG. 3B), and the penetrating electrode 40 may be exposed by grinding or polishing the insulating layer 28.

The fresh surface of the penetrating electrode 40 (projection 42 in more detail) may be exposed. For example, the projection 42 may be ground or polished until the fresh surface (surface formed only of the constituent material, that is, surface from which an oxide film and a deposited organic substance are removed) is exposed. A grindstone may be used for grinding. For example, a grindstone having a grit of about No. 100 to No. 4000 may be used. Use of a grindstone having a grit of about No. 1000 to No. 4000 prevents breakage of the insulating layer 28. Abrasive cloth may be used for polishing. The abrasive cloth may be a suede type or foamed urethane type abrasive cloth, or may be nonwoven fabric. Slurry in which colloidal silica as abrasive particles is dispersed in an alkaline cationic solution such as Na or $NH_4$ may be used for polishing. The abrasive particles may have a particle diameter of about 0.03 μm to 10 μm, and be dispersed at a percentage of about 10 wt %. The slurry may include an additive such as a chelating agent, ammonia, or a hydrogen peroxide aqueous solution. The abrasive pressure may be about 5 $g/cm^2$ to 1 $kg/cm^2$.

In the case of forming the insulating layer 28, the insulating layer 28 is ground or polished before grinding or polishing the penetrating electrode 40. Polishing or grinding of the insulating layer 28 may be continuously performed with polishing or grinding of the penetrating electrode 40. The insulating layer 28 is removed at least in the area formed on the bottom surface of the recess section 22. After exposing the penetrating electrode 40, the fresh surface of the penetrating electrode 40 may be exposed. The periphery of the end section of the penetrating electrode 40 may be covered with the insulating layer 28 while exposing the fresh surface of the penetrating electrode 40. The fresh surface of the outer layer section 32 (barrier layer, for example) may be exposed so that the fresh surface of the center section 34 of the penetrating electrode 40 is not exposed, or the fresh surfaces of the outer layer section 32 and the center section 34 may be exposed. A penetrating electrode excelling in electrical connection characteristics can be formed by exposing the fresh surface of the penetrating electrode 40. The penetrating electrode 40 may be electrically connected before the fresh surface is oxidized (immediately after the fresh surface is exposed or as soon as possible after the fresh surface is exposed (within 24 hours, for example)).

A semiconductor wafer 70 (see FIG. 11) including the penetrating electrode 40 and the insulating layer 50 can be obtained by these steps, for example. In this case, a plurality of the integrated circuits 12 are formed in the semiconductor substrate 10, and the penetrating electrodes 40 are formed corresponding to each of the integrated circuits 12. The detailed structure of the semiconductor wafer 70 may be derived from the above-described manufacturing method. Or, a semiconductor chip 80 (see FIG. 13) including the penetrating electrodes 40 and the insulating layer 50 can be obtained. In this case, one integrated circuit 12 is formed in the semiconductor substrate 10. The detailed structure of the semiconductor chip 80 may be derived from the above-described manufacturing method.

Figure 11:
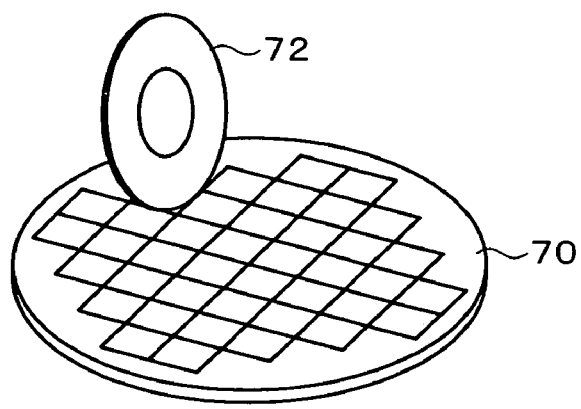
FIG. 11 illustrates a method of manufacturing a semiconductor device according to an embodiment of the present invention.

The semiconductor wafer 70 may be cut (diced, for example). As shown in FIG. 11, the semiconductor wafer 70 including the penetrating electrodes 40 and the insulating layers 50 is cut (diced, for example). A cutter (dicer, for example) 72 or a laser (CO$_2$ laser or YAG laser, for example) may be used to cut the semiconductor wafer 70. This allows the semiconductor chip 80 (see FIG. 13) including the penetrating electrodes 40 and the insulating layer 50 to be obtained. The structure of the semiconductor chip 80 may be derived from the above-described manufacturing method.

Figure 12:
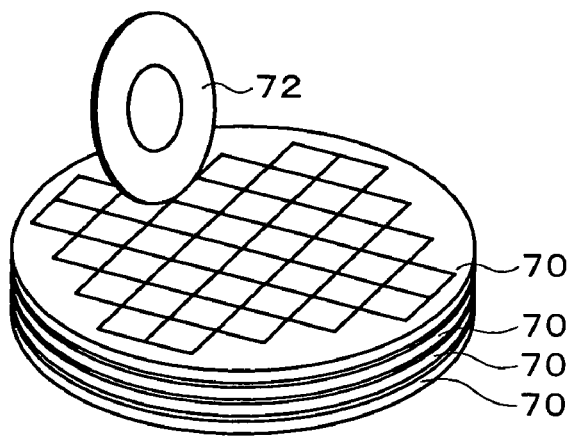
FIG. 12 illustrates a method of manufacturing a semiconductor device according to an embodiment of the present invention.
Figure 13:
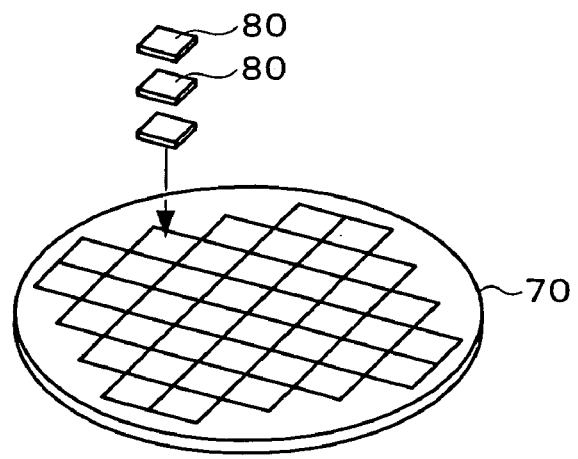
FIG. 13 illustrates a method of manufacturing a semiconductor device according to an embodiment of the present invention.

The method of manufacturing a semiconductor device may include stacking a plurality of the semiconductor substrates 10. As shown in FIG. 12, a plurality of the semiconductor wafers 70 including the penetrating electrodes 40 and the insulating layers 50 may be stacked. As shown in FIG. 13, a plurality of the semiconductor chips 80 including the penetrating electrode 40 and the insulating layer 50 may be stacked. The semiconductor chip 80 including the penetrating electrodes 40 and the insulating layer 50 and a plurality of the semiconductor wafers 70 including the penetrating electrodes 40 and the insulating layer 50 may be stacked.

The vertically adjacent semiconductor substrates 10 among the stacked semiconductor substrates 10 are electrically connected through the penetrating electrodes 40. In more detail, the vertically adjacent penetrating electrodes 40 may be electrically connected. A solder junction or a metal junction, an anisotropic conductive material (anisotropic conductive film or anisotropic conductive paste), pressure welding utilizing the shrinkage force of an insulating adhesive, or a combination of these may be used to provide electrical connection.

Figure 14:
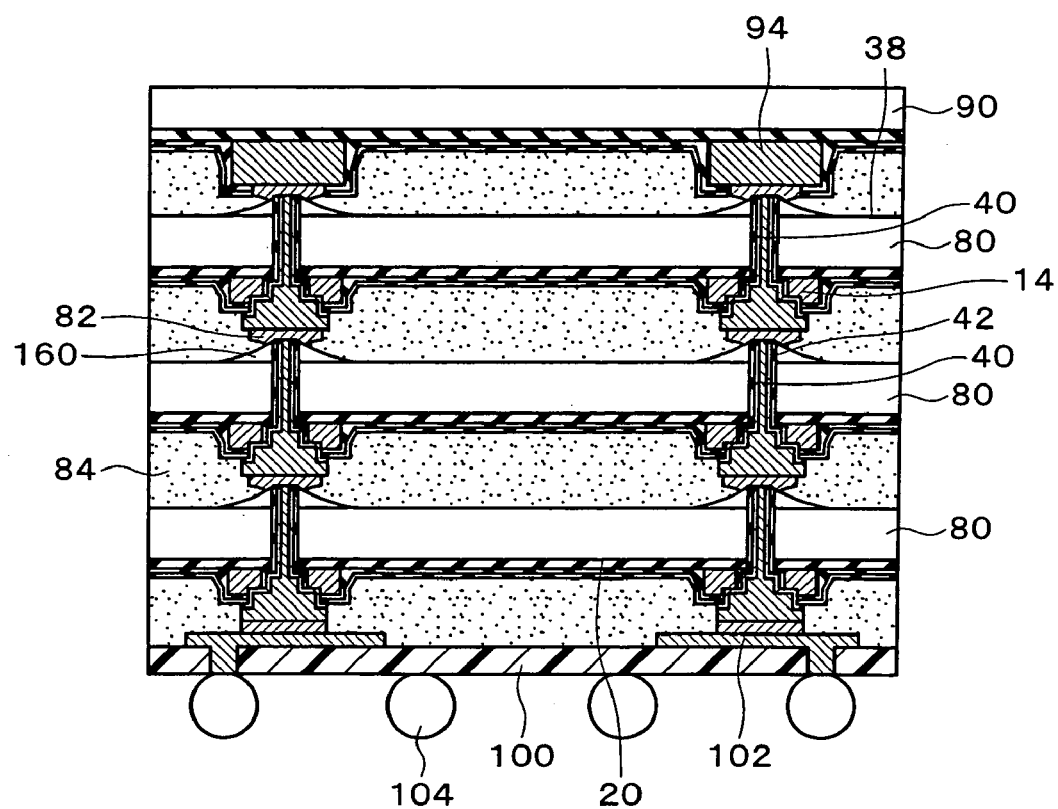
FIG. 14 shows a semiconductor device according to an embodiment of the present invention.

FIG. 14 shows a semiconductor device (stacked-type semiconductor device) according to an embodiment of the present invention. The stacked-type semiconductor device includes a plurality of the semiconductor chips 80 including the penetrating electrodes 40. The semiconductor chips 80 are stacked. The penetrating electrodes 40 or the penetrating electrode 40 and the electrode 14 may be bonded through a filler metal 82. An insulating layer (insulating layer 160 shown in FIG. 7, for example) is formed in the region around the projection 42 of the penetrating electrode 40. The filler metal 82 is placed on the insulating layer 160 so as not to come into contact with the second surface 38 of the semiconductor chip 80. Therefore, occurrence of short circuits caused by the filler metal 82 or the like is prevented. Moreover, since the insulating layer 160 has the above-described shape, a sufficient gap can be formed between the stacked semiconductor chips 80. An insulating material 84 (adhesive, resin, or underfill material, for example) may be provided to the gap. Since a sufficient gap is secured, filling of the gap with the insulating material 84 is facilitated. The bonding state of the penetrating electrode 40 is maintained or reinforced by the insulating material 84. The description derived from the method of manufacturing a semiconductor device according to the present embodiment or the modifications of the present embodiment (see FIG. 1A to FIG. 13) may be applied to the semiconductor device according to the present embodiment.

A semiconductor chip 90 which does not include a penetrating electrode may be stacked on one of the stacked semiconductor chips 80 (outermost semiconductor chip 80 in the direction of the second surface 38, for example). The description of the semiconductor chip 80 applies to the semiconductor chip 90 except that the semiconductor chip 90 does not include a penetrating electrode. The penetrating electrode 40 of the semiconductor chip 80 may be bonded to an electrode 94 of the semiconductor chip 90.

The stacked semiconductor chips 80 may be mounted on an interconnect substrate 100. The outermost semiconductor chip 80 among the stacked semiconductor chips 80 may be mounted on the interconnect substrate 100 (interposer, for example). The semiconductor chip 80 may be mounted by face down bonding. In this case, the semiconductor chip 80 having the outermost (lowermost, for example) penetrating electrode 40 in the direction of the first surface 20 is mounted on the interconnect substrate 100. For example, the projection of the penetrating electrode 40 which projects from the first surface 20 or the electrode 14 may be electrically connected with (bonded to, for example) an interconnect pattern 102. The insulating material 84 (adhesive, resin, or underfill material, for example) may be provided between the semiconductor chip 80 and the interconnect substrate 100. The bonding state of the penetrating electrode 40 or the electrode 14 is maintained or reinforced by the insulating material 84.

The stacked semiconductor chips 80 may be bonded face up to the interconnect substrate 100 (not shown). In this case, the projection 42 of the penetrating electrode 40 which projects from the second surface 38 may be electrically connected with (bonded to, for example) the interconnect pattern 102. External terminals 104 (solder balls, for example) electrically connected with the interconnect pattern 102 are formed on the interconnect substrate 100. A stress relief layer may be formed on the semiconductor chip 80, an interconnect pattern from the electrode 14 may be formed on the stress relief layer, and an external terminal may be formed on the interconnect pattern. The rest of the details may be derived from the above manufacturing method.

Figure 15:
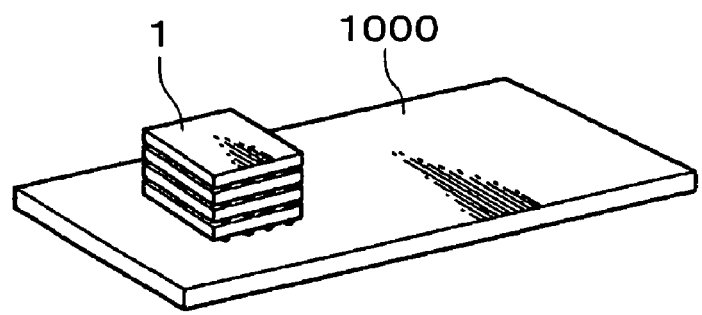
FIG. 15 shows a circuit board according to an embodiment of the present invention.
Figure 16:
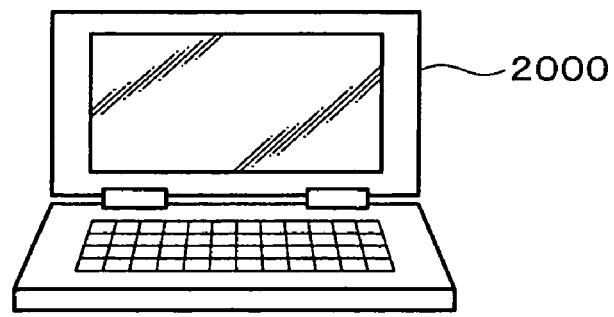
FIG. 16 shows an electronic instrument according to an embodiment of the present invention.
Figure 17:
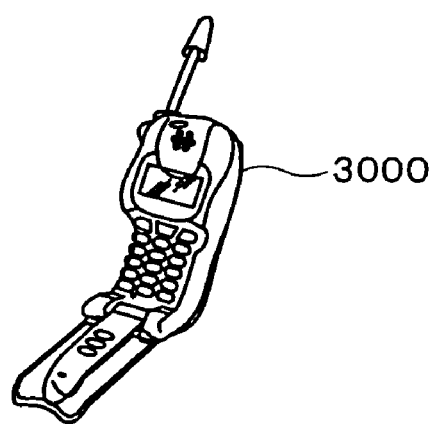
FIG. 17 shows another electronic instrument according to an embodiment of the present invention.

FIG. 15 shows a circuit board 1000 on which a semiconductor device 1, in which a plurality of semiconductor chips are stacked, is mounted. The semiconductor chips are electrically connected through the penetrating electrodes 40. FIGS. 16 and 17 respectively show a notebook-type personal computer 2000 and a portable telephone 3000 as examples of electronic instruments including the above semiconductor device.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A semiconductor chip comprising:
   a semiconductor substrate;
   an integrated circuit, at least a part of the integrated circuit being formed in the semiconductor substrate;
   a penetrating electrode which is formed in a through-hole of the semiconductor substrate from a first surface to a second surface of the semiconductor substrate, the through-hole having sidewalls entirely orthogonal to the first and second surface, and the penetrating electrode having a projection which projects from the second surface; and
   an insulating layer formed over an entire surface of the second surface of the substrate, the insulating layer including a first insulating section formed in a region that surrounds the projection such that the projection forms a through-bore in the first insulating section above the second surface of the substrate, and a second insulating section that covers a remaining region of the second surface of the semiconductor substrate, the first insulating section being connected to the second insulating section by a radially tapering arcuate portion having a varying radius of curvature from the through-bore to the second insulating section;
   wherein the second insulating section is formed to be thinner than a thickest area of the first insulating section.

2. The semiconductor chip as defined in claim 1, wherein the first insulating section is formed so that a thickness of the first insulating section decreases as a distance from the projection increases.

3. The semiconductor chip as defined in claim 1, wherein the projection is formed to have a height higher than a height of a thickest area of the insulating layer.

4. The semiconductor chip as defined in claim 1, wherein the projection is formed to have a height equal to a height of a thickest area of the insulating layer.

5. A semiconductor wafer comprising:
   a semiconductor substrate;
   a plurality of integrated circuits, at least a part of each of the integrated circuits being formed in the semiconductor substrate;
   a plurality of penetrating electrodes, each of the penetrating electrodes being formed in through-holes of the semiconductor substrate from a first surface to a second surface of the semiconductor substrate, the through-holes having sidewalls entirely orthogonal to the first and second surface, and the penetrating electrodes each having a projection which projects from the second surface; and
   an insulating layer formed over an entire surface of the second surface of the substrate, the insulating layer including a plurality of first insulating sections and a second insulating section other than the first insulating sections, each of the first insulating sections being formed in regions that surround the projections above the second surface of the substrate such that the projections define through-bores in the first insulating sections, and the second insulating section covering a remaining region of the second surface of the semiconductor substrate, the first insulating sections being connected to the second insulating section by radially tapering arcuate portions having a varying radius of curvature from the through-bore to the second insulating section;
   wherein the second insulating section is formed to be thinner than a thickest area of each of the first insulating sections.

6. The semiconductor wafer as defined in claim 5, wherein each of the first insulating sections is formed so that a thickness of each of the first insulating sections decreases as a distance from the projection increases.

7. The semiconductor wafer as defined in claim 5, wherein the projection is formed to have a height higher than a height of a thickest area of the insulating layer.

8. The semiconductor wafer as defined in claim 5, wherein the projection is formed to have a height equal to a height of a thickest area of the insulating layer.

9. A circuit board on which the semiconductor chip as defined in claim 1 is mounted.

10. An electronic instrument comprising the semiconductor chip as defined in claim 1.

* * * * *